United States Patent
Vairavanathan et al.

(10) Patent No.: US 9,665,428 B2
(45) Date of Patent: May 30, 2017

(54) DISTRIBUTING ERASURE-CODED FRAGMENTS IN A GEO-DISTRIBUTED STORAGE SYSTEM

(71) Applicant: NetApp, Inc, Sunnyvale, CA (US)

(72) Inventors: Emalayan Vairavanathan, Vancouver (CA); Dheeraj Sangamkar, Vancouver (CA); Ajay Bakre, Bangalore (IN); Vladimir Avram, Vancouver (CA); Viswanath Chandrasekara Bharathi, Bangalore (IN)

(73) Assignee: NetApp, Inc., Sunnyvale, CA (US)

( * ) Notice: Subject to any disclaimer, the term of this patent is extended or adjusted under 35 U.S.C. 154(b) by 94 days.

(21) Appl. No.: 14/614,856

(22) Filed: Feb. 5, 2015

(65) Prior Publication Data

US 2016/0232055 A1    Aug. 11, 2016

(51) Int. Cl.
*H03M 13/00* (2006.01)
*G06F 11/10* (2006.01)
*H03M 13/15* (2006.01)
*H04L 29/08* (2006.01)
*G06F 3/06* (2006.01)

(52) U.S. Cl.
CPC ............ *G06F 11/1076* (2013.01); *G06F 3/06* (2013.01); *H03M 13/154* (2013.01); *H04L 67/108* (2013.01); *H04L 67/1097* (2013.01); *H04L 67/18* (2013.01)

(58) Field of Classification Search
CPC ............. H03M 13/293; H03M 13/353; H03M 13/356; H03M 13/251; G06F 11/10
See application file for complete search history.

(56) References Cited

U.S. PATENT DOCUMENTS

| | | | | |
|---|---|---|---|---|
| 7,681,105 B1* | 3/2010 | Sim-Tang | ......... | H03M 13/2909 714/763 |
| 7,783,600 B1* | 8/2010 | Spertus | ................ | G06F 11/10 707/610 |
| 8,051,205 B2* | 11/2011 | Roy | ...................... | G06F 15/16 709/238 |
| 8,504,535 B1* | 8/2013 | He | ................... | G06F 17/30902 707/695 |
| 8,719,667 B2* | 5/2014 | Le Scouarnec | ... | H03M 13/3761 714/763 |
| 8,799,746 B2* | 8/2014 | Baker | ..................... | G06F 11/10 714/762 |
| 8,869,001 B1* | 10/2014 | Lazier | ................ | H03M 13/293 711/112 |

(Continued)

*Primary Examiner* — Esaw Abraham
(74) *Attorney, Agent, or Firm* — Gilliam IP PLLC

(57) ABSTRACT

A method, non-transitory computer readable medium, and storage management computing device that assists with distributing erasure coded fragments in geo-distributed storage nodes includes receiving an object and a storage reliability requirement from a client computing device. Erasure coding is performed on the received object using an erasure coding scheme. An erasure coding group from a plurality of erasure coding groups present in a plurality of geographically distributed storage nodes is determined based on the received storage reliability requirement and the erasure coding scheme. The erasure coded object is distributed to the determined erasure coding group from the plurality of erasure coding groups in the plurality of geographically distributed storage nodes.

11 Claims, 4 Drawing Sheets

(56) References Cited

U.S. PATENT DOCUMENTS

| | | | |
|---|---|---|---|
| 9,148,174 B2 * | 9/2015 | Baker | G06F 11/10 |
| 9,151,154 B2 * | 10/2015 | Meadows | E21B 49/02 |
| 2007/0214314 A1 * | 9/2007 | Reuter | G06F 3/0607 |
| | | | 711/114 |

* cited by examiner

DISTRIBUTING ERASURE-CODED FRAGMENTS IN A GEO-DISTRIBUTED STORAGE SYSTEM

FIELD

This technology generally relates to data storage management and, more particularly, methods for distributing erasure-coded fragments in a geo-distributed storage system and devices thereof.

BACKGROUND

Geographically distributed storage systems are used in the current technologies to store files or data by the clients due to the high end-to-end performance and reliability. To use these geographically distributed storage systems, existing technologies use erasure coding techniques. With erasure coding the data is divided into numerous data fragments and parity fragments are created. These data fragments and the created parity fragments are then distributed across geographically distributed storage systems.

However, while distributing the data fragments and parity fragments, prior technologies fails to properly address issues, such as the failure of storage systems, inefficiencies during ingestion, retrieval and repair of the data, and issues with parity fragments. Since these prior technology fail to address these issues, the storage systems are not as efficient as they could be resulting in utilization of a higher number of input/output resources. Additionally, because of these inefficiencies, client devices experience unnecessary delay while performing basic operations, such as ingesting data into the geographically distributed storage systems.

SUMMARY

A method for distributing erasure coded fragments in geo-distributed storage nodes comprising receiving, by a storage management computing device, an object and a storage reliability requirement from a client computing device. Erasure coding is performed by the storage management computing device on the received object using an erasure coding scheme. An erasure coding group from a plurality of erasure coding groups present in a plurality of geographically distributed storage nodes is determined by the storage management computing device based on the received storage reliability requirement and the erasure coding scheme. The erasure coded object is distributed by the storage management computing device to the determined erasure coding group from the plurality of erasure coding groups in the plurality of geographically distributed storage nodes.

A non-transitory computer readable medium having stored thereon instructions for distributing erasure coded fragments in geo-distributed storage nodes comprising executable code which when executed by a processor, causes the processor to perform steps includes receiving an object and a storage reliability requirement from a client computing device. Erasure coding is performed on the received object using an erasure coding scheme. An erasure coding group from a plurality of erasure coding groups present in a plurality of geographically distributed storage nodes is determined based on the received storage reliability requirement and the erasure coding scheme. The erasure coded object is distributed to the determined erasure coding group from the plurality of erasure coding groups in the plurality of geographically distributed storage nodes.

A storage management computing device includes a processor and a memory coupled to the processor which is configured to be capable of executing programmed instructions comprising and stored in the memory to receive an object and a storage reliability requirement from a client computing device. Erasure coding is performed on the received object using an erasure coding scheme. An erasure coding group from a plurality of erasure coding groups present in a plurality of geographically distributed storage nodes is determined based on the received storage reliability requirement and the erasure coding scheme. The erasure coded object is distributed to the determined erasure coding group from the plurality of erasure coding groups in the plurality of geographically distributed storage nodes.

This technology provides a number of advantages including providing methods, non-transitory computer readable medium and devices for more effectively and efficiently distributing erasure-coded fragments in a geo-distributed storage system. Additionally, this technology is able to provide a user with a reliability requirement and then store the erasure coded objects in an EC group based on the selected reliability requirement and EC scheme. Further, this technology ranks the chunk services thereby balancing ingest, repair, and retrieval load across the plurality of storage nodes.

DETAILED DESCRIPTION

Figure 1:
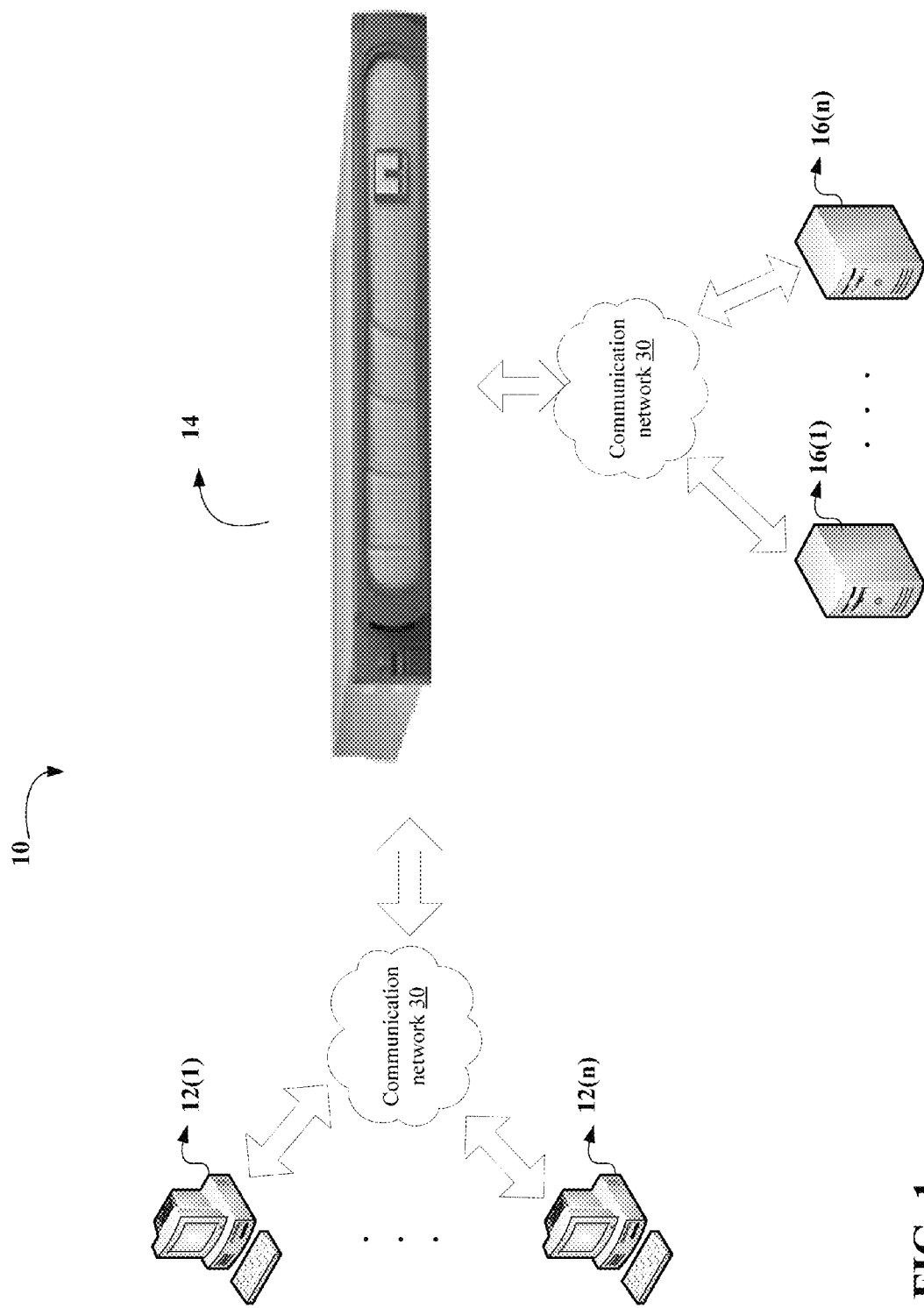
FIG. 1 is a block diagram of an environment with an exemplary storage management computing device.

An environment 10 with a plurality of client computing devices 12(1)-12(n), an exemplary storage management computing device 14, a plurality of storage nodes 16(1)-16(n) is illustrated in FIG. 1. In this particular example, the environment 10 in FIG. 1 includes the plurality of client computing devices 12(1)-12(n), the storage management computing device 14 and a plurality of storage nodes 16(1)-16(n) coupled via one or more communication networks 30, although the environment could include other types and numbers of systems, devices, components, and/or other elements. In this example, the method for distributing erasure-coded fragments in a geo-distributed storage system is executed by the storage management computing device 14 although the approaches illustrated and described herein could be executed by other systems and devices. The environment 10 may include other types and numbers of other network elements and devices, as is generally known in the art and will not be illustrated or described herein. This technology provides a number of advantages including providing methods, non-transitory computer readable medium and devices for more effectively and efficiently distributing erasure-coded fragments in a geo-distributed storage system.

Figure 2:
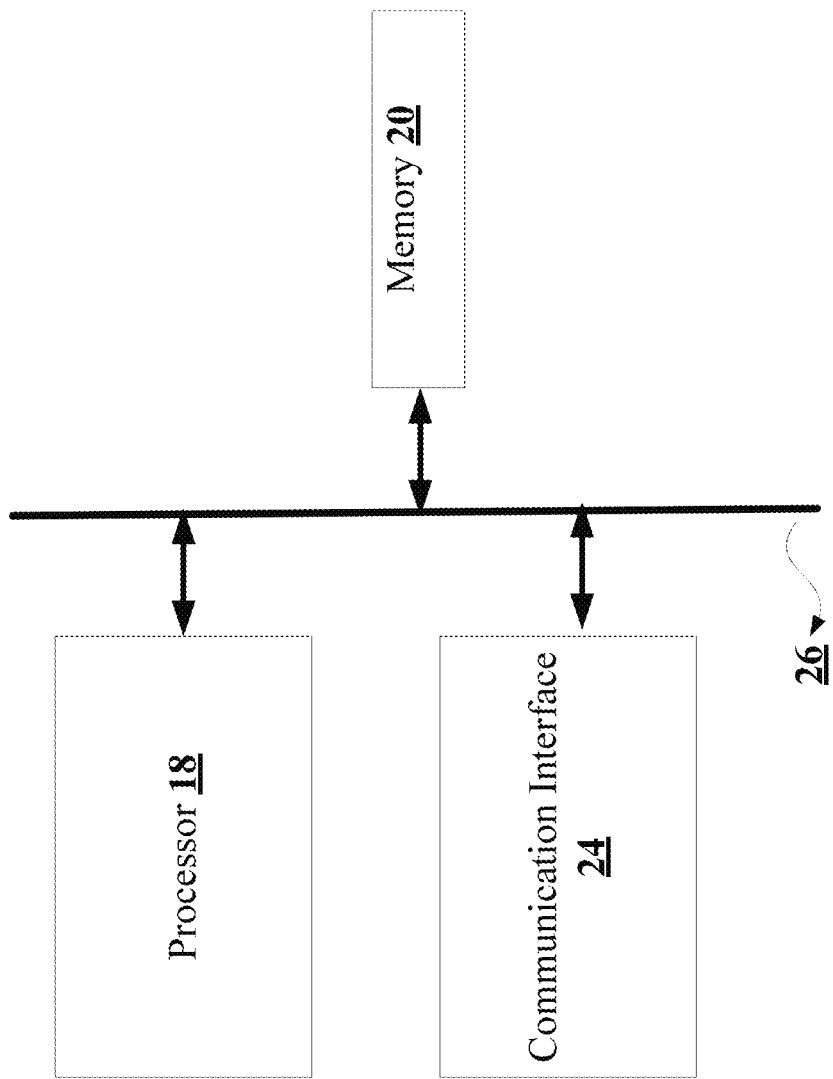
FIG. 2 is a block diagram of the exemplary storage management computing device shown in FIG. 1.

Referring to FIG. 2, in this example the storage management computing device 14 includes a processor 18, a memory 20, and a communication interface 24 which are coupled together by a bus 26, although the storage management computing device 14 may include other types and numbers of elements in other configurations.

The processor 18 of the storage management computing device 14 may execute one or more programmed instructions stored in the memory 20 for distributing erasure-coded fragments in a geo-distributed storage system as illustrated and described in the examples herein, although other types and numbers of functions and/or other operation can be performed. The processor 18 of the storage management computing device 14 may include one or more central processing units ("CPUs") or general purpose processors with one or more processing cores, such as AMD® processor(s), although other types of processor(s) could be used (e.g., Intel®).

The memory 20 of the storage management computing device 14 stores the programmed instructions and other data for one or more aspects of the present technology as described and illustrated herein, although some or all of the programmed instructions could be stored and executed elsewhere. A variety of different types of memory storage devices, such as a random access memory (RAM) or a read only memory (ROM) in the system or a floppy disk, hard disk, CD ROM, DVD ROM, or other computer readable medium which is read from and written to by a magnetic, optical, or other reading and writing system that is coupled to the processor 18, can be used for the memory 20.

The communication interface 24 of the storage management computing device 14 operatively couples and communicates with the plurality of client computing devices 12(1)-12(n) and the plurality of storage nodes 16(1)-16(n), which are all coupled together by the communication network 30, although other types and numbers of communication networks or systems with other types and numbers of connections and configurations to other devices and elements. By way of example only, the communication network 30 can use TCP/IP over Ethernet and industry-standard protocols, including NFS, CIFS, SOAP, XML, LDAP, and SNMP, although other types and numbers of communication networks, can be used. The communication networks 30 in this example may employ any suitable interface mechanisms and network communication technologies, including, for example, any local area network, any wide area network (e.g., Internet), teletraffic in any suitable form (e.g., voice, modem, and the like), Public Switched Telephone Network (PSTNs), Ethernet-based Packet Data Networks (PDNs), and any combinations thereof and the like. In this example, the bus 26 is a universal serial bus, although other bus types and links may be used, such as PCI-Express or hyper-transport bus.

Each of the plurality of client computing devices 12(1)-12(n) includes a central processing unit (CPU) or processor, a memory, an interface device, and an I/O system, which are coupled together by a bus or other link, although other numbers and types of network devices could be used. The plurality of client computing devices 12(1)-12(n) communicates with the storage management computing device 14 to storing files and data in the plurality of storage nodes 16(1)-16(n), although the client computing devices 12(1)-12(n) can interact with the storage management computing device 14 for other purposes. By way of example, the plurality of client computing devices 12(1)-12(n) may run interface application(s) that may provide an interface to make requests to access, modify, delete, edit, read or write data within storage management computing device 14 or the plurality of storage nodes 16(1)-16(n) via the communication network 30.

Each of the plurality of storage nodes 16(1)-16(n) includes a central processing unit (CPU) or processor, storage volumes within a memory, an interface device, and an I/O system, which are coupled together by a bus or other link, although other numbers and types of network devices could be used. Each of the plurality of storage nodes 16(1)-16(n) assist with storing of files and data from the plurality of client computing devices 12(1)-12(n) or the storage management computing device 14, although the plurality of storage nodes 16(1)-16(n) can assist with other types of operations. In this example, each of the plurality of storage nodes 16(1)-16(n) can be spread across different geographical locations. In another example, all of the plurality of storage nodes 16(1)-16(n) can be present in one geographical location. Additionally in this example, an erasure coding group relates to a collection of a fixed number of virtual chunk services, although the erasure coding group can include other types or amounts of information. Further, data and parity fragments of erasure coded objects are stored in the virtual chunk services contained in an erasure coding group. By way of example only, the number of virtual chunk services in an erasure coding group usually corresponds to the number of fragments required by an erasure coding scheme; for example in the case of a 6+3 scheme, the erasure coding group will have nine virtual chunk services. The virtual chunk services in an erasure coding group are allocated across distinct chunk services. Various network processing applications, such as CIFS applications, NFS applications, HTTP Web Data storage device applications, and/or FTP applications, may be operating on the plurality of storage nodes 16(1)-16(n) and transmitting data (e.g., files or web pages) in response to requests from the storage management computing device 14 and the plurality of client computing devices 12(1)-12(n). It is to be understood that the plurality of storage nodes 16(1)-16(n) may be hardware or software or may represent a system with multiple external resource servers, which may include internal or external networks. In this example the plurality of storage nodes 16(1)-16(n) may be any version of Microsoft® IIS servers or Apache® servers, although other types of servers may be used.

Although the exemplary network environment 10 includes the plurality of client computing devices 12(1)-12(n), the storage management computing device 14, and the plurality of storage nodes 16(1)-16(n) described and illustrated herein, other types and numbers of systems, devices, components, and/or other elements in other topologies can be used. It is to be understood that the systems of the examples described herein are for exemplary purposes, as many variations of the specific hardware and software used to implement the examples are possible, as will be appreciated by those of ordinary skill in the art.

In addition, two or more computing systems or devices can be substituted for any one of the systems or devices in any example. Accordingly, principles and advantages of distributed processing, such as redundancy and replication also can be implemented, as desired, to increase the robustness and performance of the devices and systems of the examples. The examples may also be implemented on computer system(s) that extend across any suitable network using any suitable interface mechanisms and traffic technologies, including by way of example only teletraffic in any suitable form (e.g., voice and modem), wireless traffic media, wireless traffic networks, cellular traffic networks, G3 traffic networks, Public Switched Telephone Network (PSTNs), Packet Data Networks (PDNs), the Internet, intranets, and combinations thereof.

The examples also may be embodied as a non-transitory computer readable medium having instructions stored thereon for one or more aspects of the present technology as described and illustrated by way of the examples herein, as described herein, which when executed by the processor, cause the processor to carry out the steps necessary to implement the methods of this technology as described and illustrated with the examples herein. An example of a method for distributing erasure-coded fragments in a geo-distributed storage system will now be described herein with reference to FIGS. 1-4.

Figure 3:
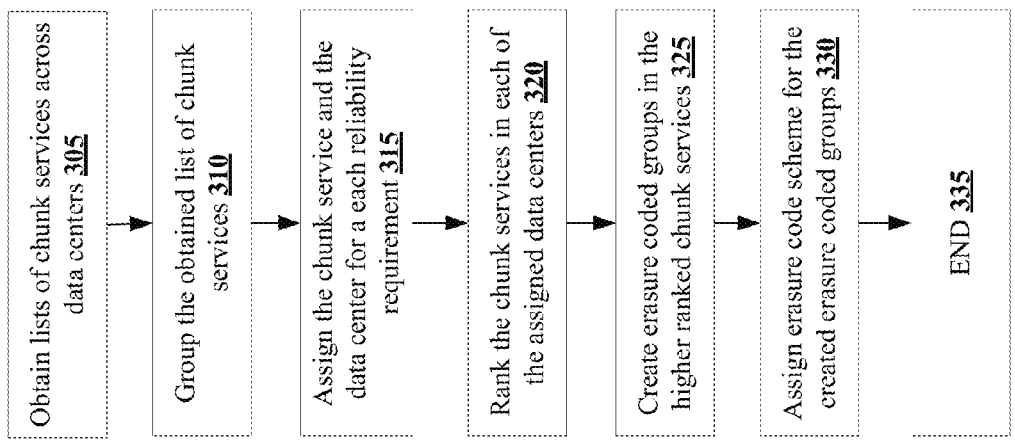
FIG. 3 is a flow chart of an example of a method for creating an erasure coded storage groups to store erasure coded data.

Referring more specifically to FIG. 3, an example of a method for creating erasure coded storage groups in the plurality of storage nodes to store erasure coded data is illustrated. At step 305, the storage management computing device 14 obtains chunk services from all the plurality of storage nodes 16(1)-16(n), although the storage management computing device 14 can obtain the list of chunk services from other devices. By way of example only, multiple storage nodes of the plurality of storage nodes 16(1)-16(n) can be grouped together based on the geographical location at which each of the plurality of storage nodes are present, although the plurality of storage nodes 16(1)-16(n) can be grouped based on other parameters or criteria. In this example, this grouping of the plurality of storage nodes 16(1)-16(n) is called a data center. As illustrated above, chunk service in this example relates to storing of erasure coded objects, although chunk service can also store other types or amounts of information. Accordingly, in this example, the storage management computing device 14 obtains the chunk services from the data centers including the plurality of storage nodes 16(1)-16(n).

Next in step 310, the storage management computing device 14 groups the obtained chunk services based on the data centers. In this example, chunk services are present within the plurality of storage nodes 16(1)-16(n) and each data center includes multiple storage nodes of the plurality of storage nodes 16(1)-16(n). Accordingly, when the storage management computing device 14 obtains the chunk services in the plurality of storage nodes 16(1)-16(n), the storage management computing device 14 may not be arranged or grouped based on the data center in which the chunk services are present. Therefore, the storage management computing device 14 groups the obtained chunk services based on the data centers, although the storage management computing device 14 can group the obtained chunk services based on other parameters.

In step 315, the storage management computing device 14 assigns a reliability requirement to each of the grouped chunk services within the plurality of storage nodes 16(1)-16(n) and the corresponding data centers. In this example, memory 20 includes a list of reliability requirements that can be provided to the plurality of client computing devices 12(1)-12(n), although the list of reliability requirements can be present at other memory locations. By way of example only, the list of reliability requirements that can be provided to the plurality of client computing devices 12(1)-12(n) includes accessing objects when a data center or volume has failed, although the list of reliability requirements can include other types of options that can be provided to plurality of client computing devices 12(1)-12(n). Accordingly in this example, each reliability requirement includes one or more group of chunk services and the corresponding data centers assigned to it.

Next in step 320, the storage management computing device 14 assigns a rank to each of the chunk service within the plurality of storage nodes 16(1)-16(n) in the assigned data centers based on the space of the chunk service, computing capacity of the chunk service and the memory of the chunk service, although the storage management computing device 14 can assign the rank based on other parameters or criteria. In this example, the storage management computing device 14 assigns a higher rank to the chunk service within the plurality of storage nodes 16(1)-16(n) that has space that is above a memory threshold, computing capacity above a computing capacity threshold and memory above a memory threshold. By way of example only, the rank assigned to the chunk service by the storage management computing device 14 is a numerical value from one to hundred (one being the highest and hundred being the lowest), although the rank assigned to the chunk service by the storage management computing device 14 can be other values.

Next in step 325, the storage management computing device 14 creates erasure coded (EC) groups in the plurality of storage nodes 16(1)-16(n) including the higher ranked chunk services to store erasure coded objects, although the storage management computing device 14 can. Prior to creating the EC groups, the storage management computing device 14 first identifies one or more EC groups with a higher rank to create the EC groups in the plurality of storage nodes 16(1)-16(n). By way of example only, the storage management computing device 14 creates EC groups in each of the plurality of storage nodes 16(1)-16(n) that includes top fifty ranked chunked services, although the storage management computing device 14 can create EC groups in the plurality of storage nodes 16(1)-16(n) including lower ranked chunk services.

In step 330, the storage management computing device 14 assigns erasure coded (EC) schemes for each of the created erasure coded groups in the plurality of storage nodes 16(1)-16(n). As it would be appreciated by a person having ordinary skill in the art, an object in erasure coding can be divided into k number of data fragments and m number of parity fragments are created by encoding the k data fragments. Therefore, the original data can be recovered from any number of k data fragments of the m+k fragments (i.e., the EC scheme can tolerate m number of failures). In this example, an EC scheme relates to different numerical values that can be assigned to k data fragments and m parity fragments. By way of example only and for purpose of further illustration, 9+3 is an EC scheme where there are nine (k=9) data fragments and three (m=3) parity fragments. Accordingly in this example, the storage management computing device 14 assigns different EC schemes such as 6+3 scheme, 12+4 scheme, or other m+k EC schemes to each of the created erasure coded groups in the plurality of storage nodes 16(1)-16(n), although other types of EC schemes can be assigned to the created erasure coded groups by the storage management computing device 14 and the exemplary method of creating EC groups end at step 335.

Figure 4:
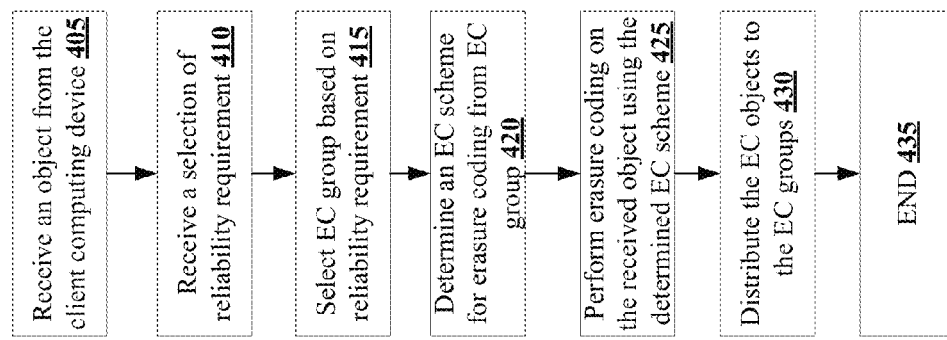
FIG. 4 is a flow chart of an example of a method for distributing erasure-coded fragments in a geo-distributed storage system using the created erasure coded storage groups.

Next, FIG. 4 illustrates a method for distributing erasure-coded fragments in a geo-distributed storage system using the created erasure coded storage groups illustrated above in FIG. 3. The exemplary method of distributing erasure-coded fragments being at step 405 where the storage management computing device 14 receives an object from one of the plurality of client computing devices 12(1)-12(n) to ingest or save in the plurality of storage nodes 16(1)-16(n), although the storage management computing device 14 can receive other types and amounts of information from the plurality of client computing devices 12(1)-12(n). In this example, an object relates to a file, although objects can include other types and/or amounts of information.

Next in step 410, the storage management computing device 14 receives a selection of one of the reliability requirement from a provided list of reliability requirements from the requesting one of the plurality of client computing devices 12(1)-12(n), although the storage management computing device 14 can receive multiple selection of the reliability requirements from the requesting one of the plurality of client computing devices 12(1)-12(n). As previously illustrated above in step 315 of FIG. 3, the list of the reliability requirements includes reliability requirements such as accessing objects when a data center or volume has failed, although the list of the reliability requirements can include other types of reliability requirements.

Next in step 415, the storage management computing device 14 selects one of plurality of EC groups that was previously created in step 325 of FIG. 3 based on the received selection of the reliability requirement from the requesting one of the plurality of client computing devices 12(1)-12(n), although the storage management computing device 14 can select the EC groups based on other parameters such as a determined EC scheme.

In step 420, the storage management computing device 14 determines one of plurality of erasure coding (EC) schemes based on the received selection of the reliability requirement, although the storage management computing device 14 can select the EC scheme based on other parameters such as type of received object, size of the received object or format of the received object. As previously illustrated in step 330 of FIG. 3, in this example, an EC scheme relates different techniques in which the object can be erasure coded into k data fragments and m parity fragments. By way of example only, different EC schemes includes, 9+3 EC scheme where there are nine (k=9) data fragments and three (m=3) parity fragments. Similarly, EC schemes can also include 6+3 EC scheme, 12+4 EC scheme or other types of m+k schemes.

In step 425, the storage management computing device 14 performs erasure coding on the received object from the requesting one of the plurality of client computing devices 12(1)-12(n) using the determined erasure coding (EC) scheme, although the storage management computing device 14 can perform erasure coding using other types of EC schemes. In this example, the storage management computing device 14 performs erasure coding using Reed Solomon erasure coding technique, which is incorporated here by reference in its entirety, although the storage management computing device 14 can use other techniques to perform erasure coding.

In step 430, the storage management computing device 14 distributes and stores the erasure coded object to the selected EC group of the plurality of EC groups in the plurality of storage nodes 16(1)-16(n), although the storage management computing device 14 can distribute and store the EC object in another EC groups. In this example, the selected EC groups to which the EC object is distributed and stored includes higher ranked chunk services, although the storage management computing device 14 can distribute and store the EC objects in EC groups having lower ranked chunk services. Additionally, while distributing and storing the EC object, if the selected EC group is full, the storage management computing device 14 proceeds to select another EC group. In this example, the storage management computing device 14 determines the selected EC group to be full when the selected EC group does not have enough memory to store erasure coded received object in the form of data fragments or parity fragments. Accordingly, when the storage management computing device 14 determines that the selected EC group is full another EC group is identified by the storage management computing device 14. Alternatively in another example, the storage management computing device 14 can create a new EC group using the technique illustrated in steps 305-330 of FIG. 3 when the selected EC group or all EC groups is determined to be full. Next the exemplary method ends in step 435.

Accordingly, as illustrated and described with reference to the examples herein, this technology provides methods, non-transitory computer readable medium and devices that are able to more effectively and efficiently distributing erasure-coded fragments in a geo-distributed storage system. By using the techniques illustrated above, the technology disclosed herein is able to provide the user with the reliability requirement and then store to erasure coded objects in the EC group based on the selected reliability requirement and EC scheme. Additionally, the technology disclosed ranks the chunk services thereby balancing ingest, repair and retrieval load across the plurality of storage nodes. Further, this technology also increases the input/output efficiency and other computing resources of the storage management computing device thereby increasing the overall performance of the storage management computing device. This technology also is able to hide the failure in the storage volumes or storage nodes by distributing and storing the erasure coded objects in the EC groups that prevent these failures.

Having thus described the basic concept of the disclosed technology, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A method for distributing erasure coded fragments in geo-distributed storage nodes, the method comprising grouping chunk services of the geo-distributed storage nodes into a plurality of groups of chunk services based, at least in part, on geographic locations of the geo-distributed storage nodes;

determining a subset of the plurality of groups of chunk services based on a reliability requirement; and within each group of the subset of the plurality of groups of chunk services, ranking the chunk services based on at least one of storage space of the chunk services in the group, computing capacity of the chunk services within the group, and memory of the chunk services within the group;

creating multiple erasure coding chunk service groups from the subset of the plurality of groups of chunk services based on the ranking, wherein the multiple erasure coding chunk service groups are associated with at least two different erasure coding schemes; and based on receipt of an object for ingest, identifying a first of the multiple erasure coding chunk service groups based on a reliability requirement associated with the object and an erasure coding scheme of the first erasure coding chunk service group; and distributing erasure coded fragments of the object across the first erasure coding chunk service group.

2. The method as set forth in claim 1 further comprising:
identifying a second of the multiple erasure coding chunk service groups based on the reliability requirement associated with the object and erasure coding scheme of the second erasure coding chunk service group; and
determining that memory associated with the second erasure coding chunk service group is full;
wherein identifying the first erasure coding chunk service group is based on determining that the memory associated with the second erasure coding chunk service is determined to be full.

3. The method as set forth in claim 1, wherein creating the multiple erasure coding chunk service groups based on the ranking comprises creating the first erasure coding chunk service group from a number of the subset of the plurality of groups of chunk services having a higher rank, wherein the number corresponds to the erasure coding scheme of the first erasure coding chunk service group.

4. A non-transitory computer readable medium having stored thereon instructions for distributing erasure coded fragments in geo-distributed storage nodes comprising executable code to:
group chunk services of the geo-distributed storage nodes into a plurality of groups of chunk services based, at least in part, on geographic locations of the geo-distributed storage nodes;
determine a subset of the plurality of groups of chunk services based on a reliability requirement;
within each group of the subset of the plurality of groups of chunk services, rank the chunk services based on at least one of a storage space of the chunk services, a computing capacity of the chunk services, and a memory of the chunk services;
create multiple erasure coding chunk service groups from the subset of the plurality of groups of chunk services based on the ranking, wherein the multiple erasure coding chunk service groups are associated with at least two different erasure coding schemes; and
based on receipt of an object for ingest,
identify a first of the multiple erasure coding chunk service groups based on a reliability requirement associated with the object and an erasure coding scheme of the first erasure coding chunk service group; and
distribute erasure coded fragments of the object across the first erasure coding chunk service group.

5. The medium as set forth in claim 4 further comprising instructions to:
identify a second of the multiple erasure coding chunk service groups based on the reliability requirement associated with the object and erasure coding scheme of the second erasure coding chunk service group; and
determine that memory associated with the second erasure coding chunk service group is full;
wherein the instructions to identify the first erasure coding chunk service group is based on a determination that the memory associated with the second erasure coding chunk service group is full.

6. The medium as set forth in claim 4 wherein the instructions to create the multiple erasure coding chunk service groups based on the ranking comprises instructions to create the first erasure coding chunk service group from a number of the subset of the plurality of groups of chunk services having a higher rank, wherein the number corresponds to the erasure coding scheme of the first erasure coding chunk service group.

7. A storage management computing device comprising:
a processor;
a machine-readable medium comprising programmed instructions executable by the processor to cause the storage management computing device to:
obtain one or more chunk services from a plurality of geographically distributed storage nodes;
group the obtained one or more chunk services;
assign each of the grouped one or more chunk services with a reliability requirement;
assign a rank to each of the assigned one or more chunk services based on at least one of a storage space of the obtained one or more chunk services, a computing capacity of the obtained one or more chunk services, and a memory of the obtained one or more chunk services;
receive an object and a storage reliability requirement from a client computing device;
perform erasure coding on the received object using an erasure coding scheme;
determine an erasure coding group from a plurality of erasure coding groups based on the received storage reliability requirement and the erasure coding scheme, wherein the plurality of erasure coding groups comprises the assigned chunk services according to the assigned ranks; and
distribute the erasure coded object to the determined erasure coding group from the plurality of erasure coding groups in the plurality of geographically distributed storage nodes.

8. The device as set forth in claim 7, wherein the machine-readable medium further comprises programmed instruction executable by the processor to cause the device to:
determine when the determined erasure coding group from the plurality of erasure coding groups is full; and
distribute the erasure coded object to the determined erasure coding group when the determined erasure coding group is determined to not be full.

9. The device as set forth in claim 8 wherein the machine-readable medium further comprises programmed instructions executable by the processor to cause the device to:
identify another erasure coding group from the plurality of erasure coding groups in the plurality of geographically distributed storage nodes based on the received storage reliability requirement and the erasure coding scheme when the determined erasure coding group is determined to be full; and
distribute the erasure coded object to the identified another erasure coding group from the plurality of erasure coding groups in the plurality of geographically distributed storage nodes.

10. The device as set forth in claim 7, wherein the machine-readable medium further comprises programmed instructions executable by the processor to cause the device to identify one or more erasure coded groups from the plurality of erasure coded groups in the plurality of geographically distributed storage nodes having a higher rank in the assigned rank to each of the assigned one or more chunk services.

11. The device as set forth in claim 10, wherein the machine-readable medium further comprises programmed instructions executable by the processor to cause the device to store the erasure coded object in the identified one or more erasure coded groups from the plurality of geographically distributed storage nodes having the higher rank.

* * * * *